United States Patent [19]
Lee

[11] Patent Number: 5,899,734
[45] Date of Patent: May 4, 1999

[54] METHOD OF FABRICATING SEMICONDUCTOR DEVICE

[75] Inventor: Hong Hee Lee, Seoul, Rep. of Korea

[73] Assignee: LG Semicon Co., Ltd., Chungcheongbuk-Do, Rep. of Korea

[21] Appl. No.: 09/083,440

[22] Filed: May 22, 1998

[30] Foreign Application Priority Data

Jun. 4, 1997 [KR] Rep. of Korea ............... 97/23177

[51] Int. Cl.$^6$ ............................................. H01L 21/28
[52] U.S. Cl. ...................... 438/584; 438/618; 438/758; 438/780; 438/781
[58] Field of Search ................................. 438/670, 584

[56] References Cited

PUBLICATIONS

Bloomfield et al. "The Design, Processing, Evaluation and Characterization of Pyroelectric PVDF Copolymer/Silicon Mosfet Detector Arrays" Proceedings of the Ninth IEEE International Symposium, pp. 725–728, 1994.

Lamarre et al. "Double–Layer Process for Wide Gate Recess Etch", IEEE Transactions on Electron Devices, vol. 35, No. 12, pp. 2422–2424, Dec. 1988.

Hong H. Lee, "Fundamentals of Microelectronics Processing", McGraw–Hill Chemical Engineering Series, 1990, title pages and pp. xi–xvi.

Gido et al., "Observation of a Non–Constant Mean Curvature Interface in an ABC Triblock Copolymer", Macromolecules 1993, vol. 26, No. 10, pp. 2636–2640.

Zheng et al., "Morphology of ABC Triblock Copolymers", Macromolecules 1995, vol. 28, No. 21, pp. 7215–7223.

*Primary Examiner*—Peter Toby Brown
*Assistant Examiner*—Maria Guerrero
*Attorney, Agent, or Firm*—Morgan, Lewis & Bockius LLP

[57] ABSTRACT

A method of fabricating a semiconductor device having a substrate includes the steps of simultaneously forming an A copolymer having a columnar shape, a B copolymer surrounding the A copolymer, and a C copolymer surrounding the B copolymer on the substrate, removing the A copolymer to form a first hole on the substrate, forming the semiconductor device in the first hole; removing the B copolymer to form a second hole, forming an electrode on the semiconductor device for controlling an electric potential, and removing the C copolymer from the substrate.

28 Claims, 13 Drawing Sheets

A: copolymer named A
B: copolymer named B
C: copolymer named C

METHOD OF FABRICATING SEMICONDUCTOR DEVICE This Korean application claims the benefit of Korean Application No. 23177/1997 filed on Jun. 4, 1997, which is hereby incorporated by reference.

BACKGROUND OF THE INVENTION

1. Field of the Invention

The present invention relates to a semiconductor device, and more particularly, to a method of fabricating a semiconductor device. Although the present invention is suitable for a wide scope of applications, it is particularly suitable for fabricating nano-scale devices without resorting to a photolithography process.

2. Discussion of the Related Art

Conventionally, photolithography is a required process in fabricating a semiconductor device. As dimensions of semiconductor devices become further reduced, a photolithography process almost reaches to its limits. Moreover, at least dozens of masks are required in the semiconductor device fabrication process. For instance, in order to fabricate 1 giga DRAMs using a conventional photolithography process, about forty masks are necessary to complete the process since the size of a unit cell becomes about 180 nm.

Although single electron transistors (SET) have been researched recently, an appropriate process for integrating single electron transistors has not been fully developed. Further, quantum dots, which are an essential element of the single electron transistors, are still larger than nanometer dimensions. Thus, problems in forming and arranging the quantum dots having desired size and location are yet to be solved in this area.

As previously described, the conventional method of fabricating a semiconductor device has the following problems.

Since patterns having dimensions larger than nanometers can not be processed due to the limitation of the photolithography process, it is impossible to fabricate nano-scale semiconductor devices. Moreover, since at least dozens of masks should be used in a fabricating process of a semiconductor device using photolithography technology, the process becomes very complicated and the production yield becomes low.

SUMMARY OF THE INVENTION

Accordingly, the present invention is directed to a method of fabricating a semiconductor device that substantially obviates one or more of the problems due to limitations and disadvantages of the related art.

An object of the invention is to provide a method of fabricating a nano-scale semiconductor device without resorting to photolithography technology.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating a semiconductor device includes the steps of forming on a substrate an ABC triblock copolymer including an A copolymer of an inner column, a B copolymer of an outer column, and a C copolymer surrounding the B copolymer, selectively removing the A copolymer, forming a body of the semiconductor device in the inner column where the A copolymer is removed, selectively removing the B copolymer and forming an electrode controlling potential of the body, and removing the C copolymer.

In another aspect of the present invention, a method of fabricating a semiconductor device having a substrate, comprising the steps of: (1) simultaneously forming an A copolymer having a columnar shape, a B copolymer surrounding the A copolymer, and a C copolymer surrounding the B copolymer on the substrate; (2) removing the A copolymer to form a first hole on the substrate; (3) forming the semiconductor device in the first hole; (4) removing the B copolymer to form a second hole; (5) forming an electrode on the semiconductor device for controlling an electric potential; and (6) removing the C copolymer from the substrate.

In another aspect of the present invention, a method of fabricating a semiconductor device having a substrate, comprising the steps of: (1) forming an ABC copolymer on the substrate; (2) segregating the ABC copolymer to an A copolymer, a B copolymer, and a C copolymer, the B copolymer surrounding the A copolymer, and the C copolymer surrounding the B copolymer on the substrate; (3) removing the A copolymer from the substrate to form a first hole; (4) successively forming a first semiconductor layer having a first conductivity type, a second semiconductor having a second conductivity type, and a third semiconductor layer having the first conductivity type in the first hole; (5) removing the B copolymer from the substrate to form a second hole; (6) forming a first insulating layer in the second hole; (7) successively forming a gate insulating layer on the first, second, and third semiconductor layers; (8) forming a fourth semiconductor layer on the gate insulating layer; (9) removing the C copolymer from the substrate; and (10) oxidizing a surface of the fourth semiconductor layer to form a gate electrode.

In another aspect of the present invention, a method of fabricating a semiconductor device having a substrate, comprising the steps of: (1) forming a first metal layer on the substrate; (2) forming an ABC triblock copolymer on the first metal layer; (3) segregating the ABC triblock copolymer to an A copolymer, a B copolymer surrounding the A copolymer, and a C copolymer surrounding the B copolymer on the first metal layer; (4) removing the A copolymer from the substrate to form a first hole; (5) successively forming a first semiconductor layer having a first type conductivity, a second semiconductor layer having a second type conductivity, and a third semiconductor layer having the first type conductivity; (6) forming a second metal layer on the third semiconductor layer; (7) removing the B copolymer from the substrate to form a second hole; (8) forming a first insulating layer in the second hole, the first insulating layer having a height as high as the middle of the first semiconductor layer; (9) forming a gate insulating layer on the first, second, and third semiconductor layers; (10) forming a fourth semiconductor layer on the gate insulating layer; (11) removing the C copolymer from the substrate; (12) selectively removing the first metal layer using the fourth semiconductor layer and the first insulating layer as masks; (13) forming a bit line over the substrate, the bit line contacting the first metal layer; (14) forming a second insulating layer having a height as high as the middle of the second semiconductor layer; (15) forming a word line on the second insulating layer, the word line contacting the fourth semiconductor layer; (16) forming a third insulating layer on the second insulating layer including the word line, the third insulating layer having a height as high as the middle of the third semiconductor layer; (17) oxidizing a surface of the fourth semiconductor layer to form a gate electrode; (18) forming a fourth insulating layer having a height as high as the middle of the second metal layer to expose a portion of the second metal layer; and (19) forming a capacitor on the second metal layer including the fourth insulating layer.

In another aspect of the present invention, a method of fabricating a semiconductor device having a substrate, comprising the steps of: (1) forming a first metal layer on the substrate; (2) forming an ABC triblock copolymer on the first metal layer; (3) segregating the ABC triblock copolymer to an A copolymer, a B copolymer, and a C copolymer, the B copolymer surrounding the A copolymer, and the C copolymer surrounding the B copolymer on the substrate; (4) removing the A copolymer from the substrate; (5) successively forming a first semiconductor layer having a first type conductivity, a second semiconductor layer having a second type conductivity, a third semiconductor layer having the first type conductivity, and a second metal layer in a first space left after removing the A copolymer; (6) removing the B copolymer from the substrate; (7) forming a first insulating layer having a height as high as the mid of the first semiconductor layer in a second space left after removing the B copolymer; (8) forming a gate insulating layer on surfaces of the first, second, and third semiconductor layers; (9) forming a fourth semiconductor layer on the gate insulating layer; (10) removing the C copolymer from the substrate; (11) selectively removing the first metal layer using the fourth semiconductor layer and the first insulating layer as masks; (12) forming a plurality of bit lines on the substrate; (13) forming a second insulating layer having a height as high as the mid of the second semiconductor layer; (14) forming a plurality of word lines on the second insulating layer; (15) forming a third insulating layer on the second insulating film including the word lines, the third insulating layer having a height as high as the mid of the third semiconductor layer; (16) oxidizing an exposed portion of the fourth semiconductor layer to form a gate electrode; (17) depositing a fourth insulating layer having a height as high as the mid of the second metal layer; (18) exposing a portion of the second metal layer; (19) forming a dielectric layer on the second metal layer; and (20) forming a third metal layer on the dielectric layer.

In a further aspect of the present invention, a method of: fabricating a semiconductor device having a substrate, comprising the steps of: (1) forming on an ABC triblock copolymer on the substrate; segregating the ABC trilock copolymer to including an A copolymer, a B copolymer surrounding the A copolymer, and a C copolymer surrounding the B copolymer on the substrate; (2) removing the A copolymer from the substrate; (3) forming a first semiconductor layer having a first type conductivity in a first space where the A copolymer is removed; (4) forming a second semiconductor layer having a second type conductivity on the first semiconductor layer and adjusting a doping concentration. (5) successively forming a third semiconductor layer having the first type conductivity and a second metal layer on the second semiconductor layer; (6) removing the B copolymer from the substrate; (7) selectively removing the first, second, and third semiconductor layers so that the second semiconductor layers has a circumferential recess around a mid portion of the second semiconductor layer; (8) forming a first insulating layer having a height as high as the mid of the first semiconductor layer in a second space where the B copoly-mer has been removed; (9) forming a first gate insulating layer on the first, second, and third semiconductor layers; (10) forming a quantum dot on the gate insulating layer around the circumferential recess; (11) forming a second gate insulating layer on the first gate insulating layer including the quantum dot; (12) forming a fourth semiconductor layer on the second gate insulating layer; (13) removing the C copolymer from the substrate; (14) forming a second insulating layer having a height as high as the mid of the third semiconductor layer; and (15) oxidizing an exposed portion of the fourth semiconductor layer to form a gate electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

In accordance with the present invention, a nano-scale semiconductor device is fabricated without resorting to a photolithography process. Particular types of copolymers, such as ABC triblock copolymers are used in the present invention. A, B, and C copolymers have different chemical structures. For example, A is poly(2-vinylpyridine)(p2vp), B is polyisoprene(PI), and C is polystyrene(PS). Depending upon compositions of the copolymers, various morphologies can be obtained. One of the examples is shown in FIG. 1.

Figure 1:
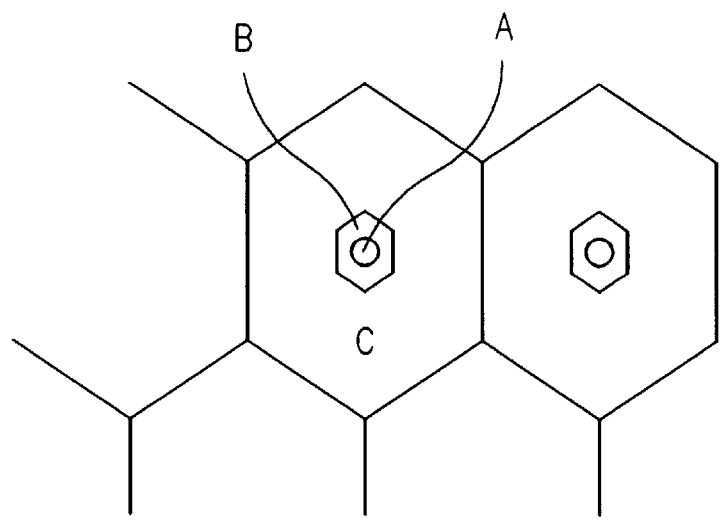
FIG. 1 is a schematic view showing a micro-structure of a copolymer.
Figure 2:
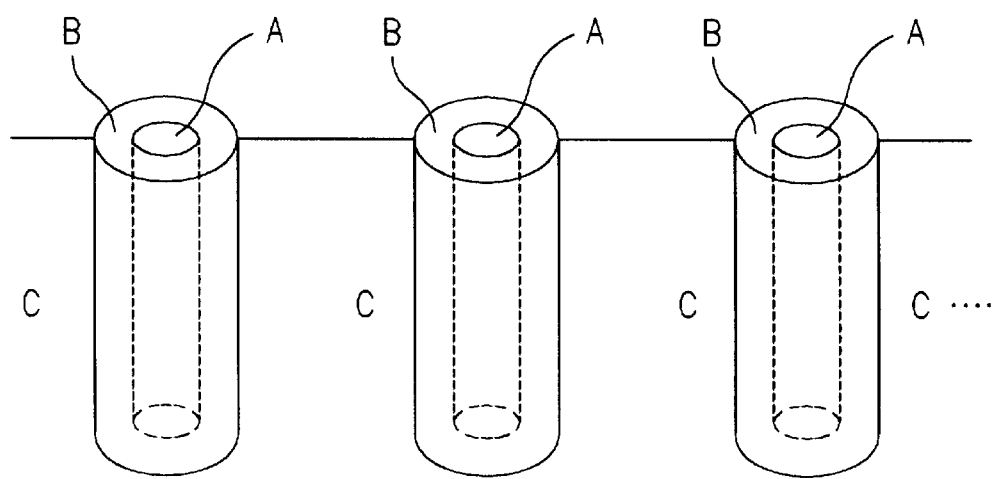
FIG. 2 is a cross-sectional view showing a micro-structure of a copolymer.

Referring to FIG. 1, the copolymers in a solution state are subjected to spin coating and then an annealing process, so that a phase-segregation takes place. As a result, as shown in FIGS. 1 and 2, columns are formed and spaced apart from one another by a predetermined distance. Molecular weights of A, B, and C copolymers of the ABC triblock copolymers are adjusted to obtain desired diameters and distances between the columns. For example, a distance between columns is about 30 nm. Diameters of the outer column and the inner column are about 20 nm and 10 nm, respectively.

Alternatively, when the C copolymer having a star shape is pasted after forming an AB diblock copolymer, or a fourth copolymer is used, the distances between the columns in both directions (X and Y axises) can be adjusted with a blending process.

Each of the copolymers is dissolved in an appropriate solvent. Thus, only one of the columns of A and B can be etched by the solvent. For example, toluene may be used in this process.

The copolymers having these features are described in Macromolecules, Vol. 28, No. 21, 1995, pages 7215–7223, "Morphology of ABC Triblock copolymers" and Macromolecules, Vol. 26, No. 10, 1993, pages 2636–2640, "Observation of a Non-Constant Mean Curvature Interface in an ABC Triblock Copolymer."

A method of fabricating a semiconductor device by using copolymers having the above characteristics in accordance with a first embodiment of the present invention will now be described with reference to the accompanying drawings.

FIGS. 3A to 3L are cross-sectional views showing the process steps of fabricating a MOSFET using copolymers in accordance with the first embodiment of the present invention.

Figure 3A:
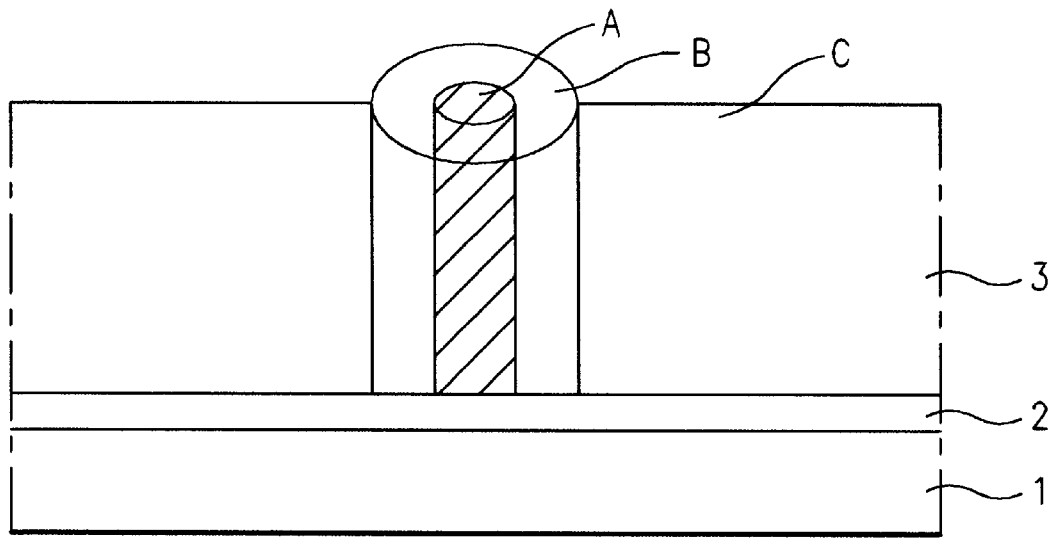
FIGS. 3A to 3L are cross-sectional views showing the process steps of fabricating a semiconductor device in accordance with a first embodiment of the present invention.

Referring to FIG. 3A, a metal layer 2 to be used as a metal wire at a source (source electrode or bit line) is formed on a semiconductor substrate 1. An ABC triblock copolymer 3 having a predetermined thickness is formed on the entire surface of the metal layer 2 by a spin coater and is then annealed. The annealed copolymer 3 is phase-segregated so that an A copolymer is positioned in an inner column and a B copolymer surrounds the A copolymer as an outer column. A plurality of an AB diblock copolymers are also formed in a matrix form and spaced apart from one another by a predetermined distance. The weights of the A and B copolymers are adjusted to have desired distances between columns in the X and Y directions. A thickness of the A, B, and C copolymers 3 is almost identical to that of the MOSFET.

Figure 3B:
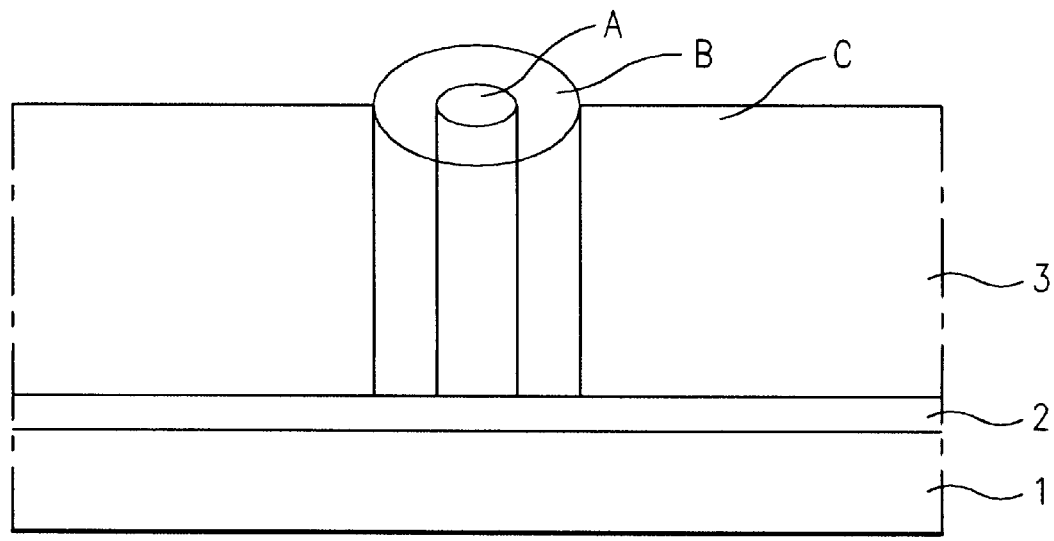

In FIG. 3B, the A copolymer, which is located in the inner column, is removed.

Figure 3C:
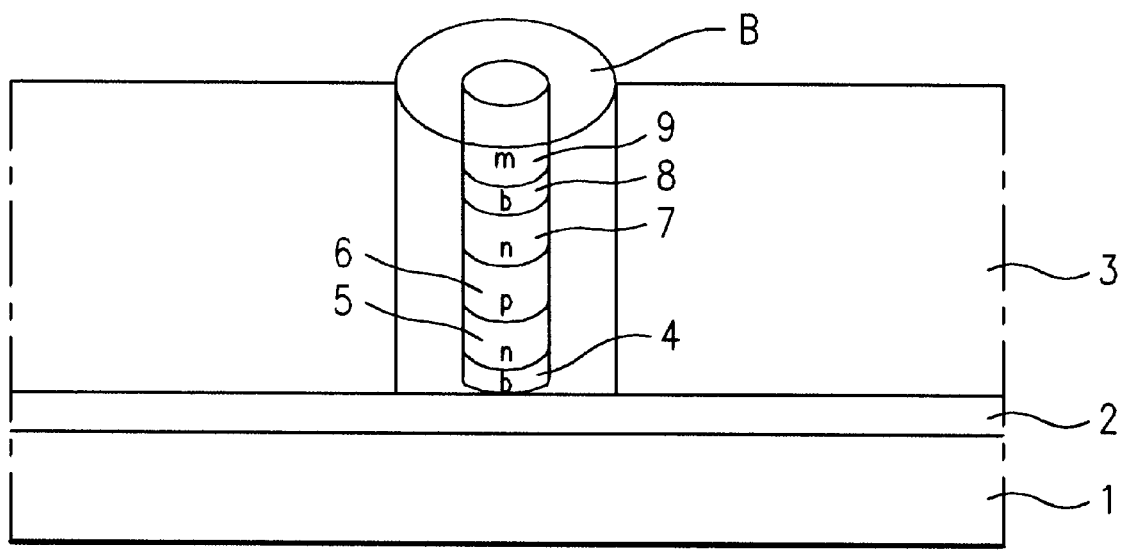

A metal barrier layer 4 is filled inside the B copolymer where the A copolymer is removed as shown in FIG. 3C. An n-type silicon layer 5, a p-type silicon layer 6, and an n-type silicon layer 7 are successively formed on the metal barrier layer 4. Then, a metal barrier layer 8 and a second metal layer 9 are successively formed to completely fill the inner column where the A copolymer is removed. In this process, phosphine and silane ($Si_xCl_{4-x}$) are used simultaneously to form the n-type silicon layer 5 by a chemical vapor deposition method.

Figure 3D:
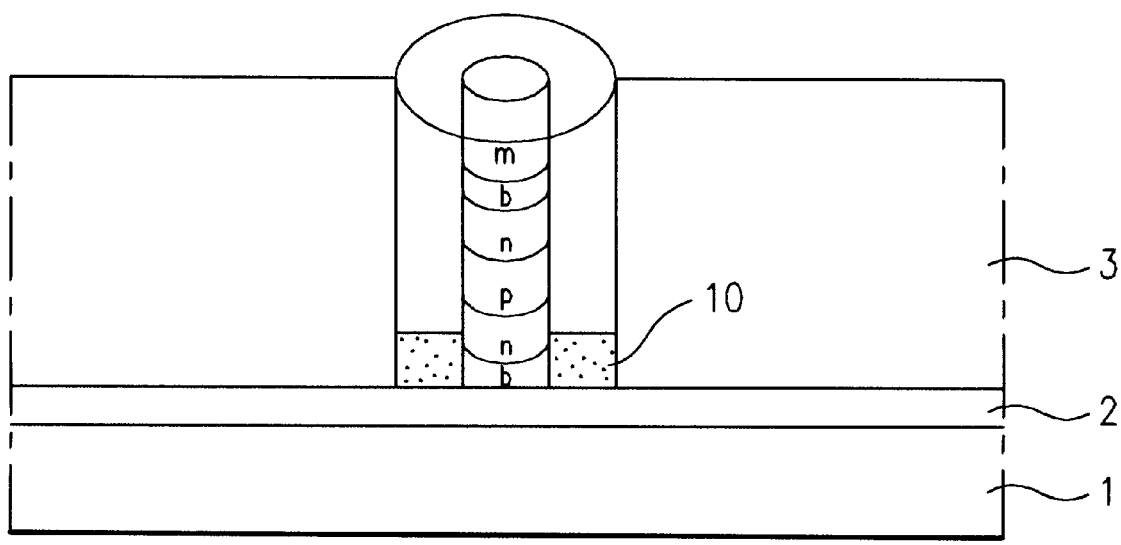

In FIG. 3D, the B copolymer as the outer column is removed by the appropriate solvent. In this process, the layers filling the inner column surrounded by the B copolymer are not removed.

A silicon oxide layer 10 ($SiO_2$) is formed in the outer column of the B copolymer as high as one-half of the height of the n-type silicon layer 5 above the metal layer 2 using chemical vapor deposition.

Figure 3E:
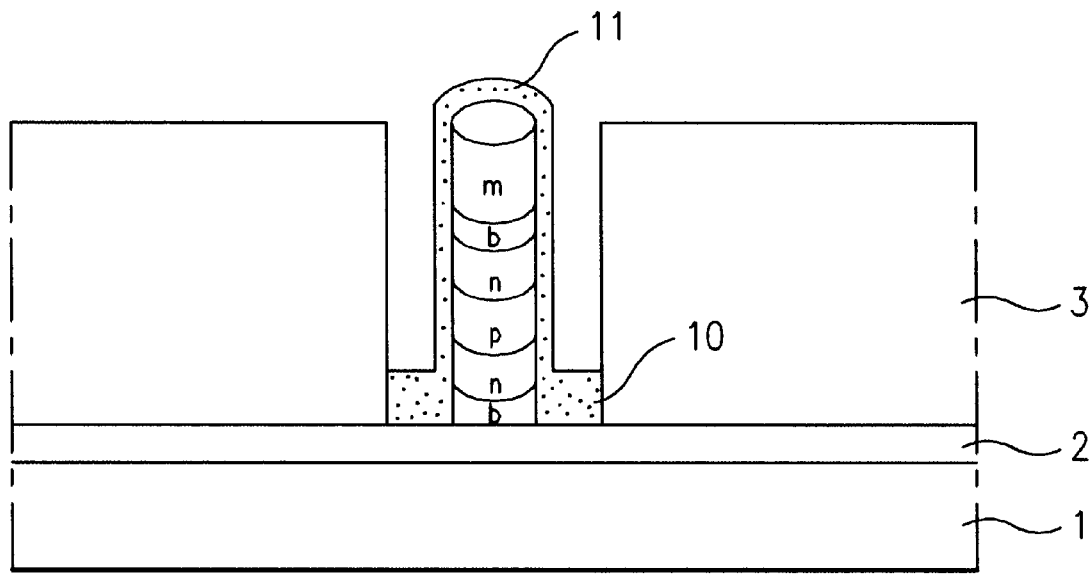

Referring to FIG. 3E, silicon oxide layers 11 are deposited layer by layer on the surface of the inner column. In this process, each silicon oxide layer has a thickness of one molecule. Deposition of the silicon oxide layer 11 are accomplished by chemical absorption from a source gas. In other words, using the source gas containing Si and O, each one-molecular thick layers are repeatedly absorbed until a desired thickness is obtained.

Figure 3F:
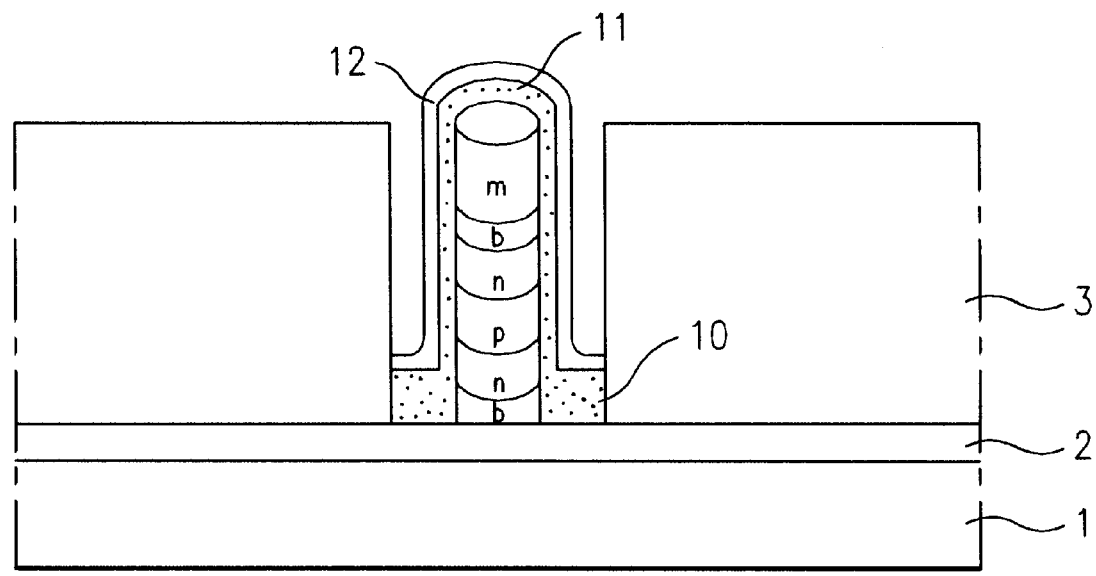

Referring to FIG. 3F, a silicon layer 12 is formed on the silicon oxide layer 11 by the same method as the silicon oxide layers 11 are formed. A gas containing silicon is used as a source gas and the silicon layer is used as a gate electrode of an MOSFET.

Figure 3G:
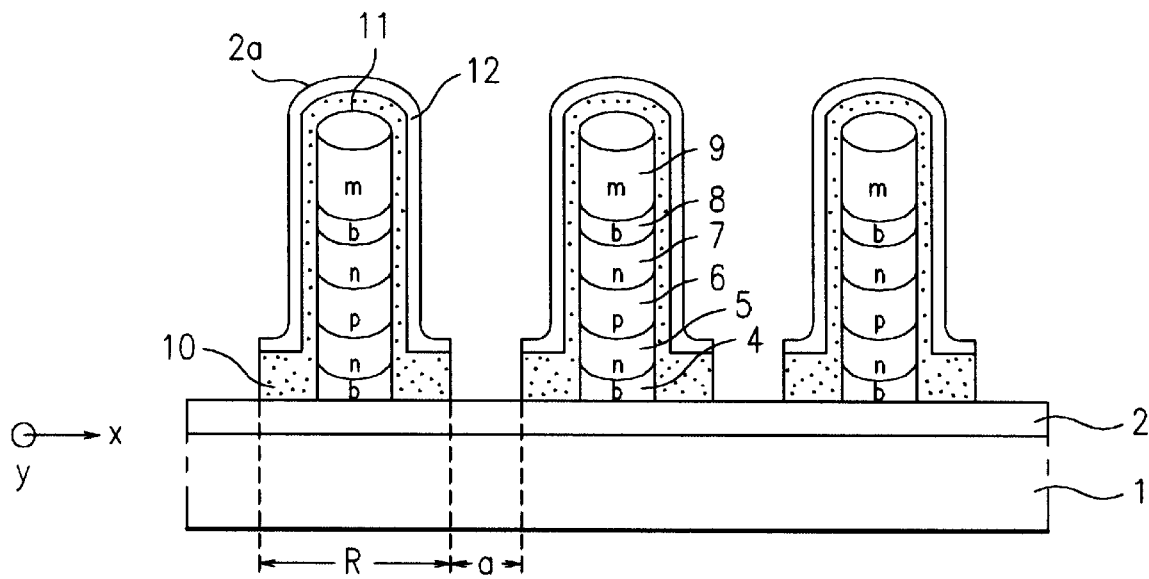

The C copolymer is removed using the appropriate solvent in FIG. 3G.

Figure 3H:
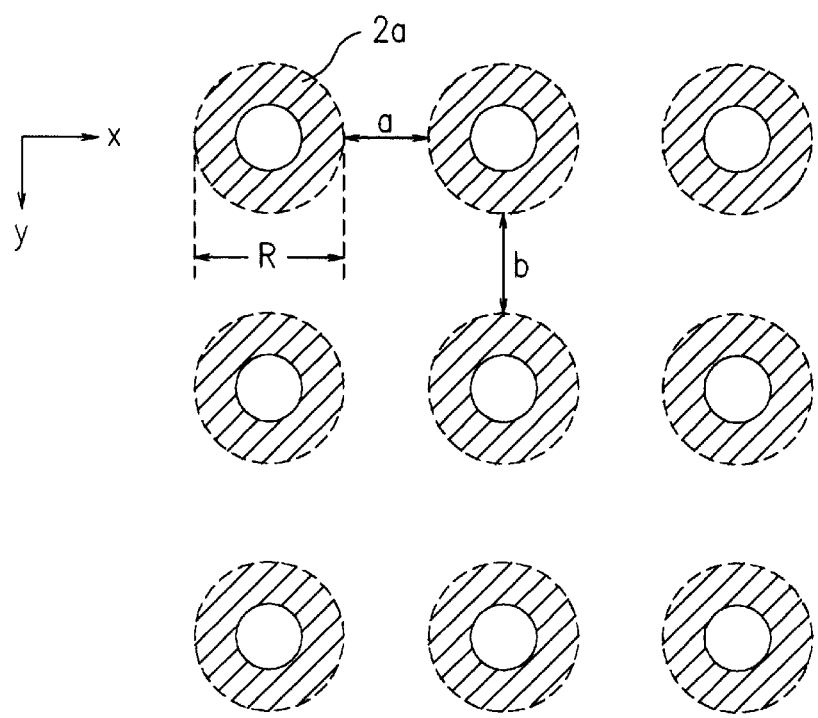

FIG. 3H is a plan view after the first metal layer 2 is etched with an ion etching process to form metal patterns 2a having an island shape. Each metal pattern 2a has an area at the bottom wider than the rest of the portion of the column.

Figure 3I:
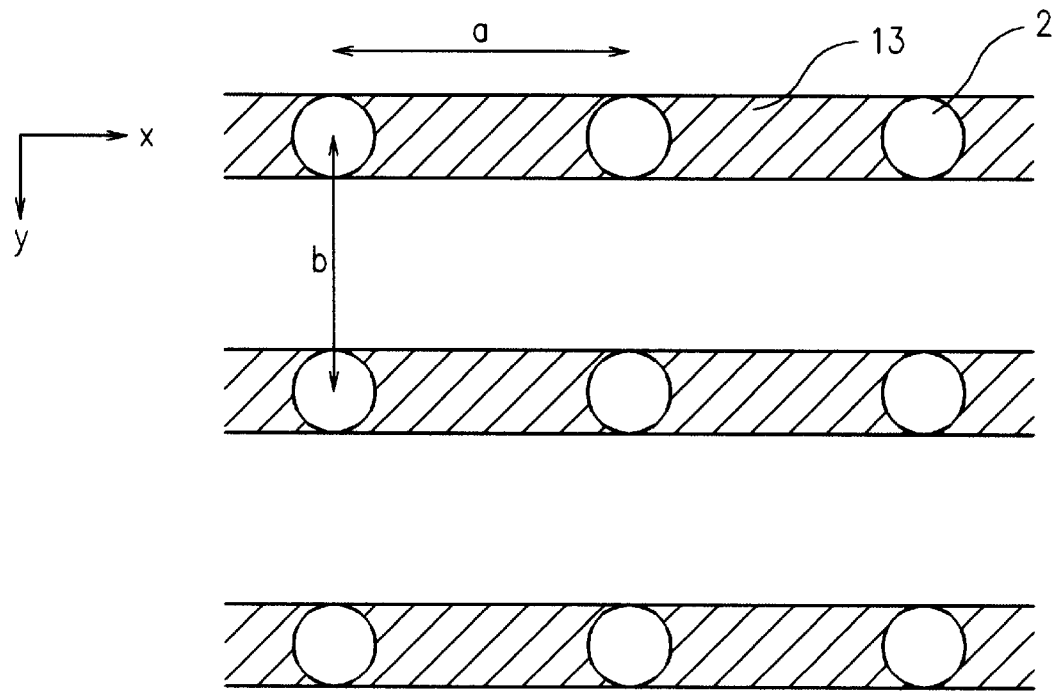

Referring to FIG. 3I, several atom layers are deposited on the entire surface to form a metal layer 13 and then annealed, so that the metal layer 13 is aligned in a direction of either X or Y axis whichever has a shorter distance between the metal patterns 2a. The distance between the metal patterns 2a becomes minimized by reducing a chemical potential.

For example, the distance between two metal patterns 2a in the directions of X and Y axis are "a" and "b", respectively. If $2a \leq b$, the metal is aligned to the direction of X axis, so that the metal layer 13 is selectively formed in a line in the direction of X axis, but not on the entire surface. In this case, if $R/a \leq 0.91$ where, "R" is the diameter of the metal patterns 2a and "a" is the distance between the metal patterns 2a in the direction of X axis), surface tension is minimized. The metal atoms form the metal patterns 2a, so that the metal 13 has a line shape. The metal line in this process is used as a bit line.

Also, even if the distance between the patterns 2a in the direction of X axis is similar to that in the direction of Y axis, a bit line can be formed in one direction. For example, a bias is applied to a desired direction for a bit line and the above process described is repeated. The bit line is then formed in the direction in which the bias is applied.

Figure 3J:
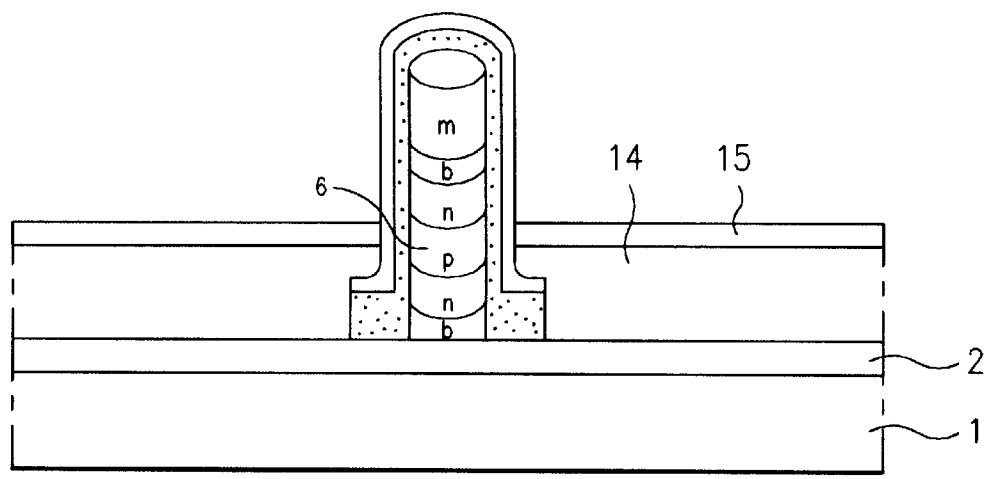

Referring to FIG. 3J, a silicon oxide layer 14 is formed up to one-half the height of the p-type silicon layer 6 above the metal layer 2. Then, a silicon layer 15 is deposited on the silicon oxide layer 14 and is subjected to an ion etching process, thereby forming word lines.

Figure 3K:
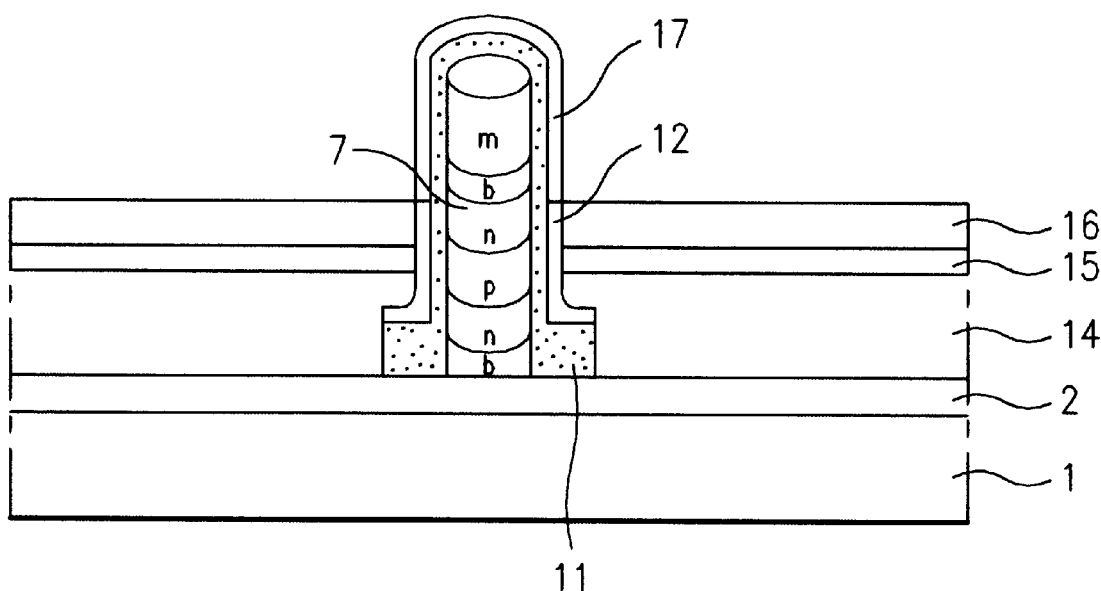

Referring to FIG. 3K, a silicon oxide layer 16 is deposited as high as the middle of the n-type silicon layer 7. The silicon layer 12 not covered by the silicon oxide layer 16 is oxidized to form another silicon oxide layer 17.

Figure 3L:
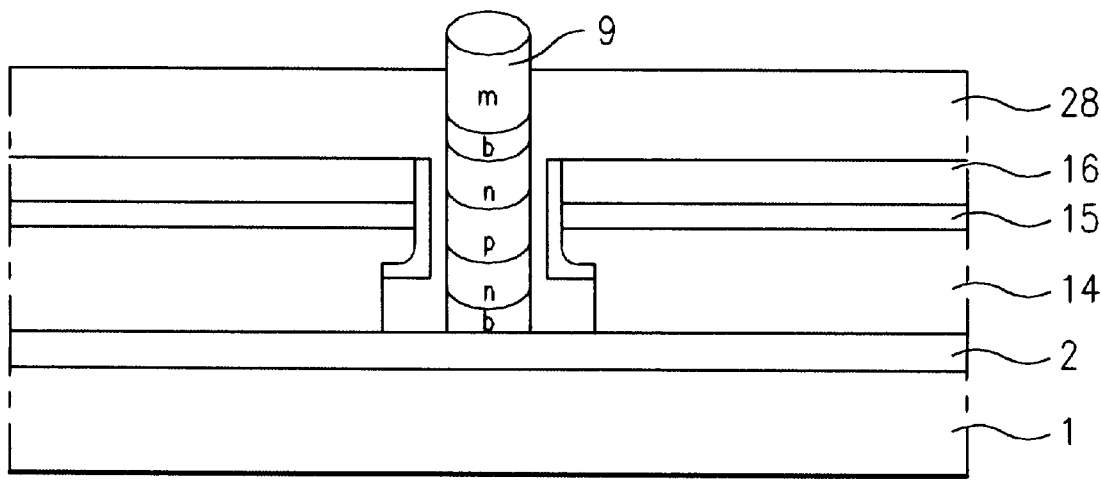

In FIG. 3L, a silicon oxide layer 28 is formed as high as the middle of the second metal layer 9. By removing portions of the fourth insulating layer 28, the silicon oxide layer 17, and the first insulating layer 12 to expose a portion of the second metal layer 9, the process of forming an MOSFET is completed.

A method of forming a capacitor of a DRAM in accordance with a first embodiment of the present invention will be described with reference to FIGS. 4A to 4C.

Figure 4A:
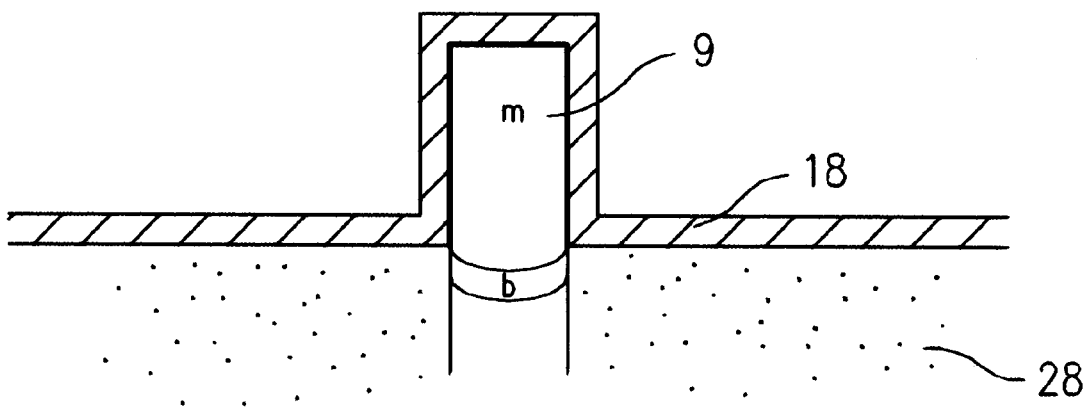
FIGS. 4A to 4C are cross-sectional views showing the process steps of fabricating a capacitor in accordance with a first embodiment of the present invention.

As shown in FIG. 4A, a dielectric film 18 is deposited on the entire surface after fabrication process of the MOSFET as described in FIG. 3L.

Figure 4B:
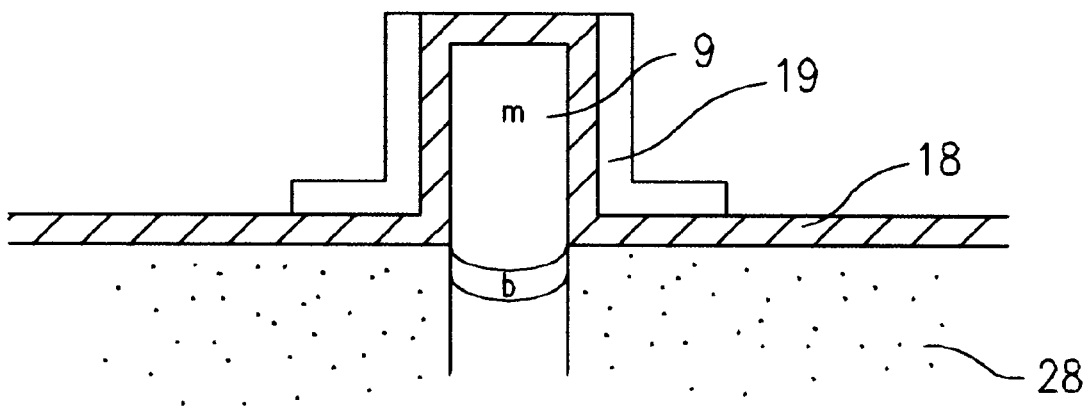

Referring to FIG. 4B, a metal layer 19 is deposited on the entire surface and is then anisotropically etched. As a result, the metal layer 19 only remains on the sides of the dielectric film 18. The metal layers 9 and 19 become a storage node of a capacitor and a plate node of the capacitor, respectively.

Figure 4C:
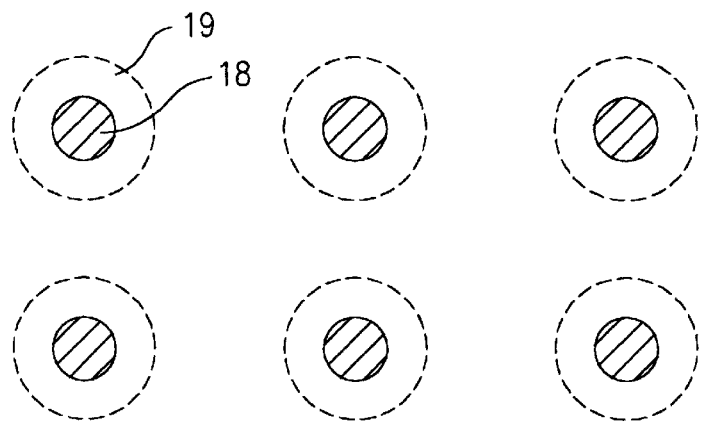

FIG. 4C is a plan view after the metal layer 19 is formed.

In this method, another metal layer may be formed on the surface of the metal layer 9 in order to increase the capacitance. Alternatively, a wrinkled portion may be formed on the surface of the metal layer 9 to increase the surface area of the metal layer 9, thereby increasing the capacitance.

Figure 5A:
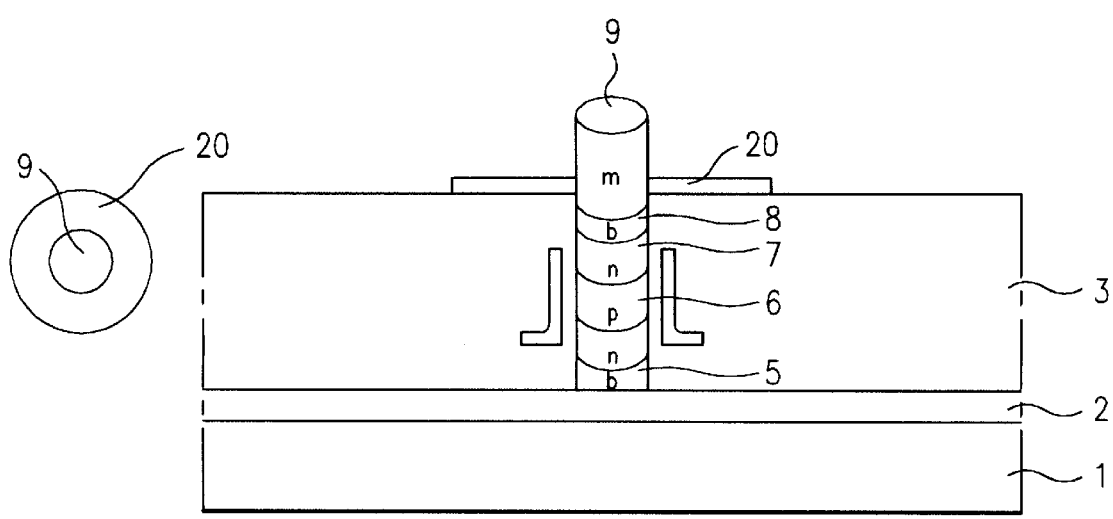
FIGS. 5A to 5C are cross-sectional views showing the process steps of fabricating a capacitor in accordance with the second embodiment of the present invention.
Figure 5B:
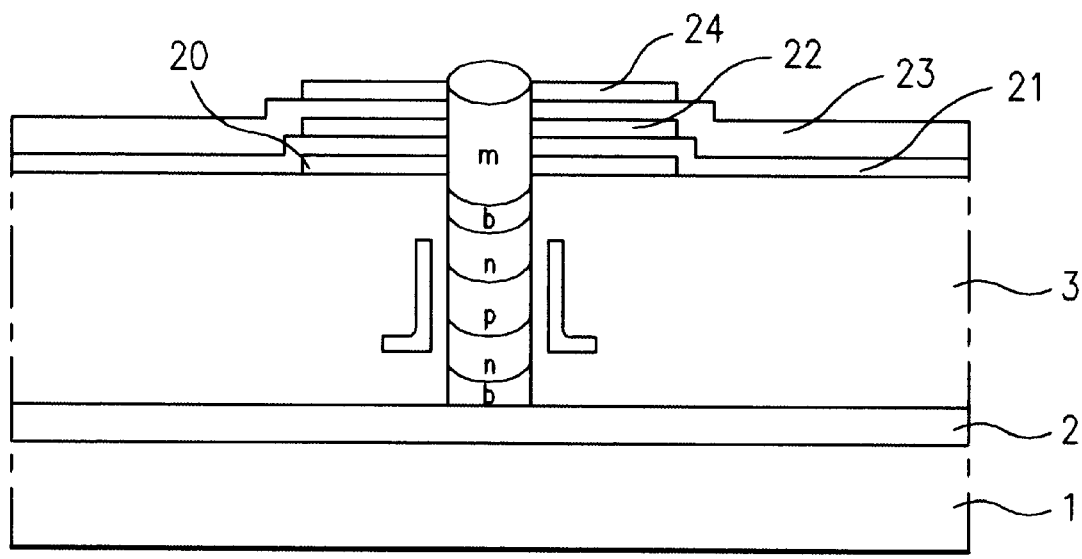
Figure 5C:
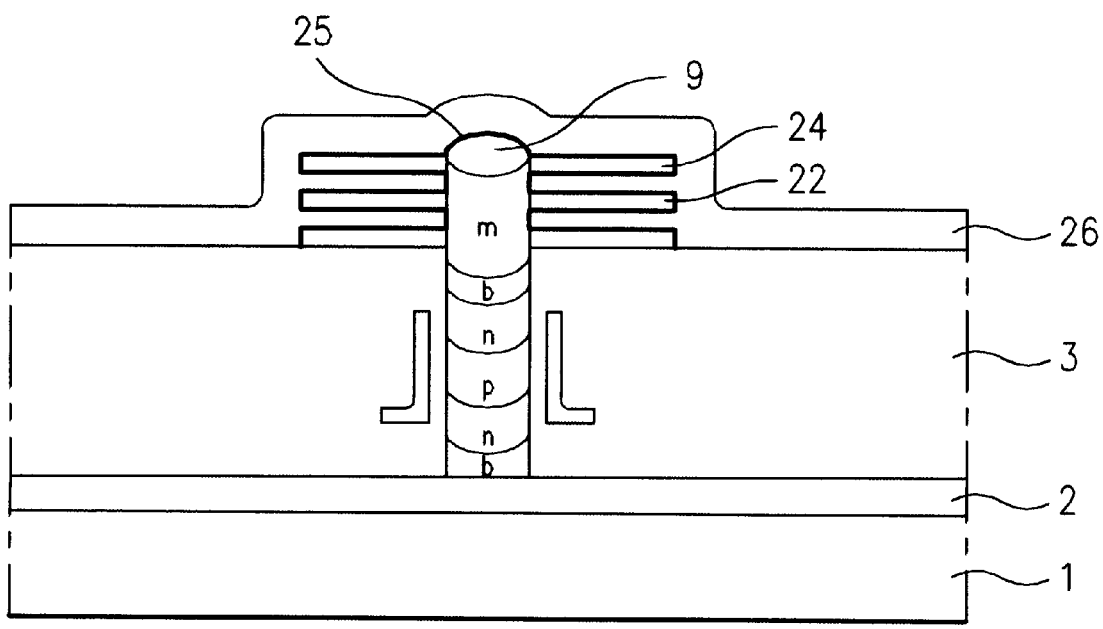

FIGS. 5A to 5C are cross-sectional views showing the process steps of forming a capacitor in accordance with the second embodiment of the present invention.

As shown in FIG. 5A, several atomic layers are deposited layer by layer to form a metal layer after completing the process shown in FIG. 3L and then annealed to form a metal layer 20 only around the metal layer 9. This process utilizes sintering.

Referring to FIG. 5B, an insulating layer 21, such as a nitride layer having an etching ratio higher than the silicon oxide film 17, is formed on the silicon oxide layer 17 including the metal layer 20. Next, several one-atom-thick layers are deposited layer by layer to form a metal layer 22 and then annealed. An insulating film 23 is then formed on the metal layer 22 including the insulating layer 21. These processes are repeatedly performed to form metal layers 22 and 24 having a wing shape at both sides of the metal layer 9.

Referring to FIG. 5C, the insulating layers are all removed to form a storage node of a capacitor. A dielectric layer 25 is deposited on the surface of the storage node. A metal layer is then deposited to form a plate node 26 of the capacitor.

A method of fabricating a single electron transistor in accordance with a third embodiment of the present invention will be described as following.

FIGS. 6A to 6F are cross-sectional views showing process steps of fabricating a semiconductor device in accordance with the second embodiment of the present invention.

The process shown in FIGS. 3A to 3G is also applied to the method of fabricating a single electron transistor in this embodiment of the present invention.

An ABC triblock copolymer 33 having a predetermined thickness is formed on the entire surface of a semiconductor substrate 31 by a spin coater, as shown in FIGS. 3A to 3G. Next, the ABC triblock copolymer 33 is annealed so that AB diblock columns each having an A copolymer and a B copolymer are formed and spaced apart from one another by a predetermined distance.

By using an appropriate solvent (for example, toluene), the A copolymer is selectively removed. An n-type silicon layer 35, a p-type silicon layer 36, and an n-type silicon layer 37 are successively formed in the inner column where the A copolymer is removed.

Subsequently, a metal barrier layer 38 and a metal layer 39 are successively formed on the n-type silicon layer 37. When the p-type silicon layer 36 is formed, the doping level is adjusted so that the center portion of the p-type silicon layer 36 has the highest doping concentration. The lower the doping concentration, the further from the center portion of the p-type silicon layer 36.

Thereafter, another type solvent removes the B copolymer. Next, the n-type semiconductor layer 35, the p-type semiconductor layer 36, and the n-type semiconductor layer 37 are etched with a low etching rate using a chemical etching process. In this process, the portion having a high doping concentration is etched with a relatively high etching rate compared to the other portions having low doping concentration. Since the p-type silicon layer 36 has the described doping profile, the center portion of the p-type silicon layer 36 has a concave shape.

Figure 6A:
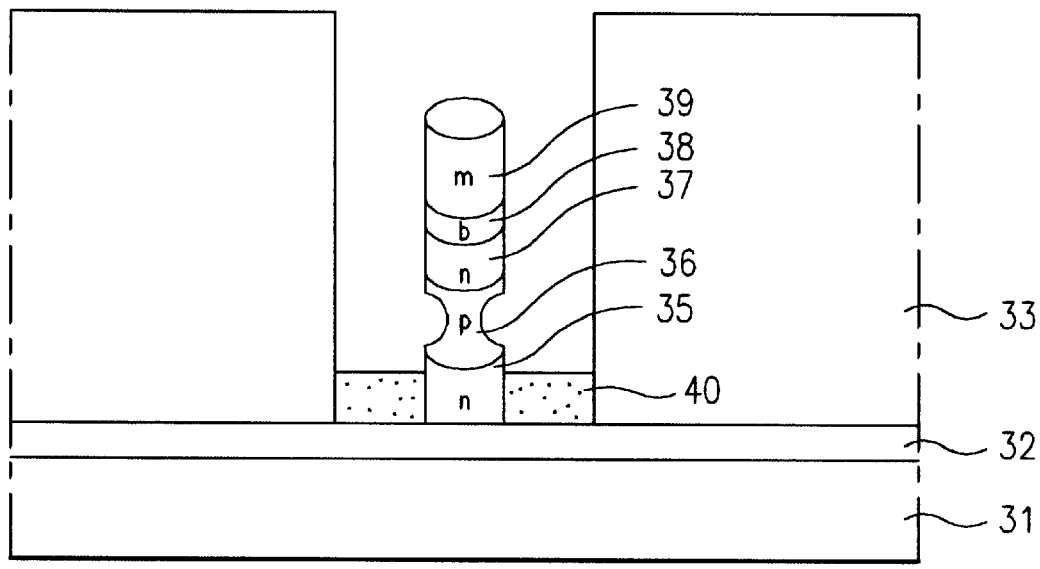
FIGS. 6A to 6F are cross-sectional views showing the process steps of fabricating a semiconductor device in accordance with a second embodiment of the present invention.
Figure 6B:
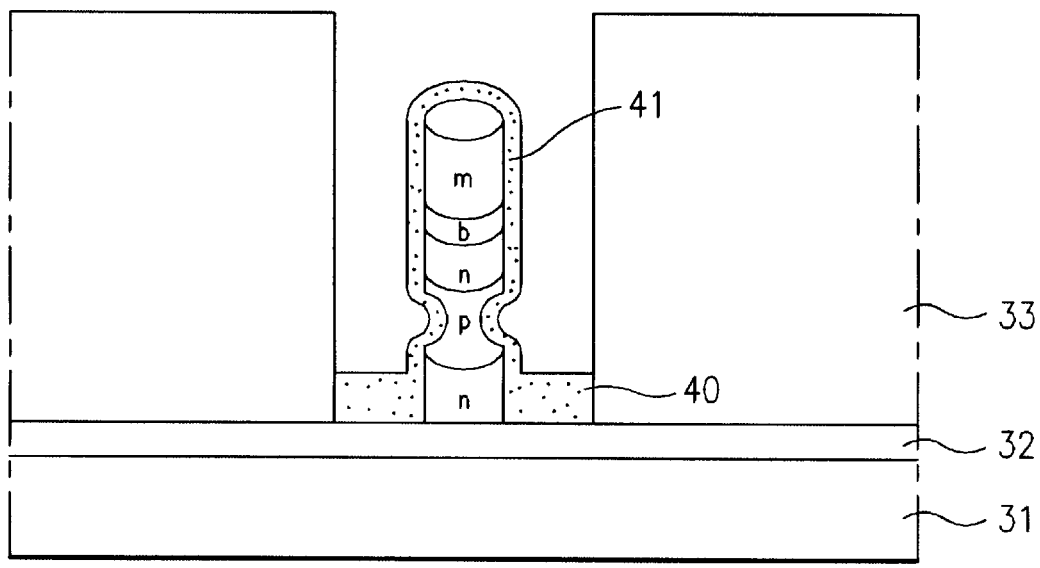

Referring to FIG. 6A, a silicon oxide layer 40 ($SiO_2$) is formed as high as the middle of the n-type silicon layer 35 on the outer column where the B copolymer is removed. In FIG. 6B silicon oxide layers 41 are formed layer by layer on the surface of the inner column. In this process, the silicon oxide film 41 is formed by a chemical absorption using source gas containing Si and O. One-molecular thick layers are repeatedly absorbed layer by layer until the silicon oxide layer 41 reaches a desired thickness.

Figure 6C:
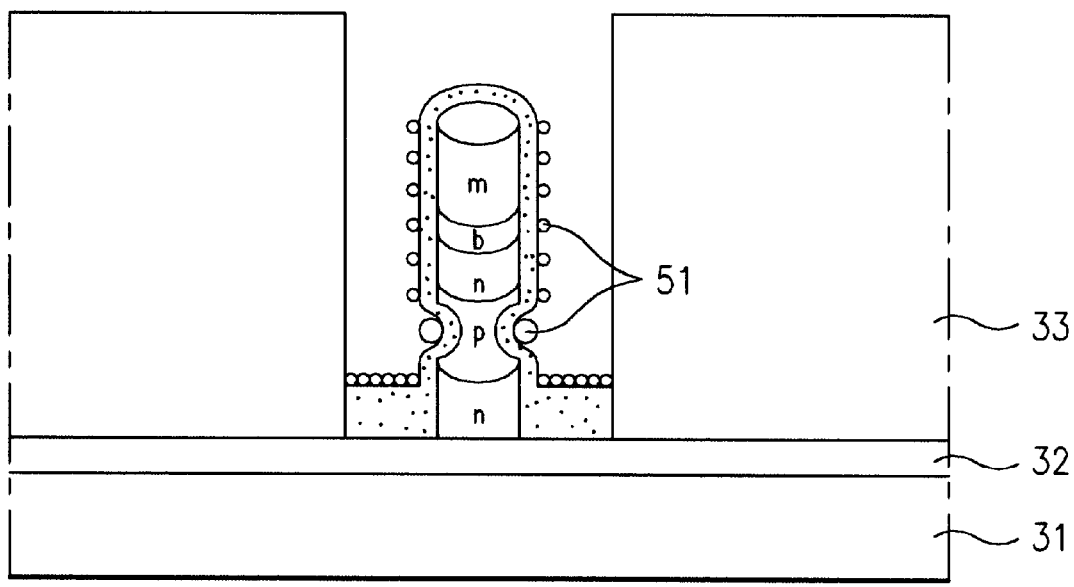

Referring to FIG. 6C, after depositing the silicon layer by series of process of a chemical absorption, deposition and annealing, small quantum dots 51 are generated by sintering. Around the concave portion of the p-type silicon layer 36, due to geometry of the portion, the dot is bigger than others formed at the other areas.

Figure 6D:
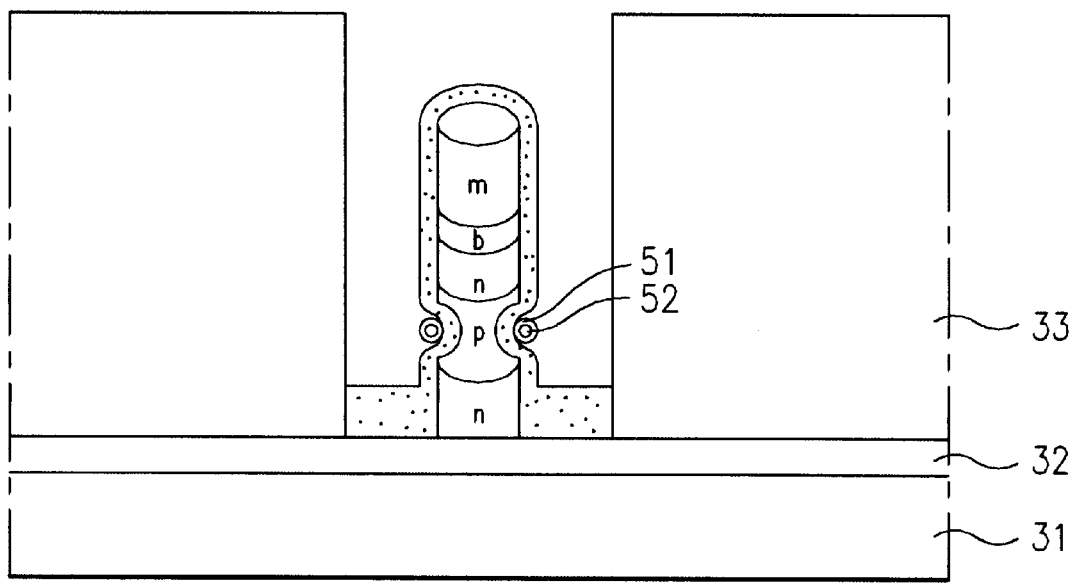

Referring to FIG. 6D, the silicon 51 is oxidized using a source gas such as ozone. In this process, the small quantum dots are completely oxidized to become a silicon oxide layer 52.

Only the surface of the silicon dot around the concave portion of layer 36 is oxidized and the center portion still remains as the silicon dot 51. The quantum dot may have a desired size by adjusting oxidizing time and conditions.

Figure 6E:
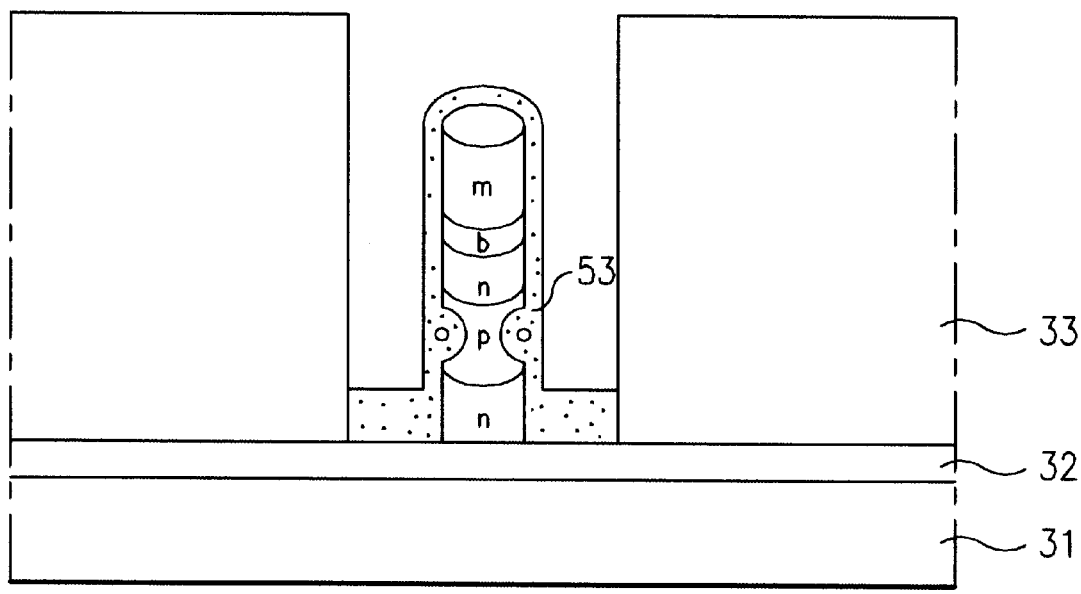

Referring to FIG. 6E, silicon layers 53 each having one atomic thickness are deposited repeatedly by a chemical absorption until a desired thickness is obtained.

Figure 6F:
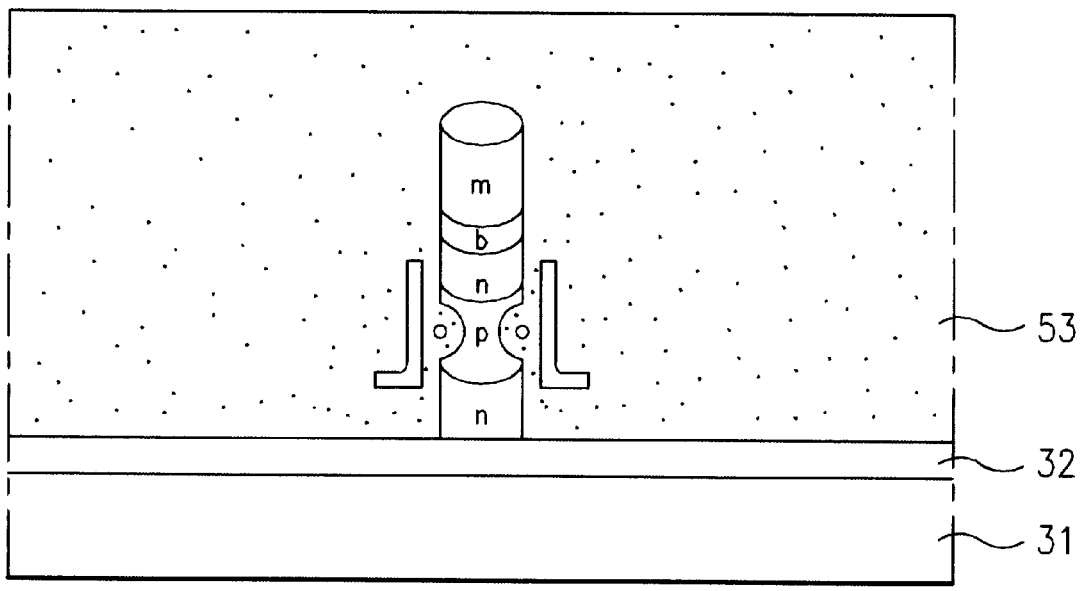

Referring finally to FIG. 6F, the process of FIGS. 3G to 3L are performed to complete the single electron transistor.

A method of fabricating a semiconductor device of the present invention has the following advantages.

An ABC triblock copolymer has an inner column and an outer column in a matrix form. Pairs of the inner column and the outer column surrounding the inner column are spaced apart from one another by a predetermined distance. Thus, photo-etching processes for forming field regions and active regions are not necessary, thereby simplifying the overall process.

Moreover, since columns are formed to have a height shorter than 30 nm and photolithography is not employed, a nano-scale semiconductor device is formed using the present invention.

Further, since A and B copolymers having a shape of columns are selectively removed and a semiconductor device is formed to have a vertical structure inside the columns, a memory device having a sub-nano scale is completed.

It will be apparent to those skilled in the art that various modifications and variations can be made in the method of fabricating a semiconductor device of the present invention without departing from the spirit or scope of the invention. Thus, it is intended that the present invention cover the modifications and variations of this invention provided they come within the scope of the appended claims and their equivalents.

What is claimed is:

1. A method of fabricating a semiconductor device having a substrate, comprising the steps of:

simultaneously forming an A copolymer having a columnar shape, a B copolymer surrounding the A copolymer, and a C copolymer surrounding the B copolymer on the substrate;

removing the A copolymer to form a first hole on the substrate;

forming the semiconductor device in the first hole;

removing the B copolymer to form a second hole;

forming an electrode on the semiconductor device for controlling an electric potential; and removing the C copolymer from the substrate.

2. A method of fabricating a semiconductor device having a substrate, comprising the steps of:

forming an ABC copolymer on the substrate;

segregating the ABC copolymer to an A copolymer, a B copolymer, and a C copolymer, the B copolymer surrounding the A copolymer, and the C copolymer surrounding the B copolymer on the substrate;

removing the A copolymer from the substrate to form a first hole;

successively forming a first semiconductor layer having a first conductivity type, a second semiconductor having a second conductivity type, and a third semiconductor layer having the first conductivity type in the first hole;

removing the B copolymer from the substrate to form a second hole;

forming a first insulating layer in the second hole;

successively forming a gate insulating layer on the first, second, and third semiconductor layers;

forming a fourth semiconductor layer on the gate insulating layer;

removing the C copolymer from the substrate; and oxidizing a surface of the fourth semiconductor layer to form a gate electrode.

3. The method according to claim 2, wherein the step of segregating the ABC copolymer is executed by an annealing process.

4. The method according to claim 2, wherein the gate insulating layer is formed by successively absorbing one-molecular thick layers using a source gas containing silicon and oxygen.

5. The method according to claim 2, wherein the first insulating layer is formed as high as the middle of the first semiconductor layer.

6. The method according to claim 2, wherein the second insulating layer is formed as high as the middle of the third semiconductor layer.

7. The method according to claim 2, wherein the first, second, and third semiconductor layers are formed by a chemical absorption method.

8. The method according to claim 7, wherein the fourth semiconductor layer is formed by successively absorbing one-molecular thick layers using a source gas containing silicon.

9. A method of fabricating a semiconductor device having a substrate, comprising the steps of:

forming a first metal layer on the substrate;

forming an ABC triblock copolymer on the first metal layer;

segregating the ABC triblock copolymer to an A copolymer, a B copolymer surrounding the A copolymer, and a C copolymer surrounding the B copolymer on the first metal layer;

removing the A copolymer from the substrate to form a first hole;

successively forming a first semiconductor layer having a first type conductivity, a second semiconductor layer having a second type conductivity, and a third semiconductor layer having the first type conductivity;

forming a second metal layer on the third semiconductor layer;

removing the B copolymer from the substrate to form a second hole;

forming a first insulating layer in the second hole, the first insulating layer having a height as high as the middle of the first semiconductor layer;

forming a gate insulating layer on the first, second, and third semiconductor layers;

forming a fourth semiconductor layer on the gate insulating layer;

removing the C copolymer from the substrate;

selectively removing the first metal layer using the fourth semiconductor layer and the first insulating layer as masks;

forming a bit line over the substrate, the bit line contacting the first metal layer;

forming a second insulating layer having a height as high as the middle of the second semiconductor layer;

forming a word line on the second insulating layer, the word line contacting the fourth semiconductor layer;

forming a third insulating layer on the second insulating layer including the word line, the third insulating layer having a height as high as the middle of the third semiconductor layer;

oxidizing a surface of the fourth semiconductor layer to form a gate electrode;

forming a fourth insulating layer having a height as high as the middle of the second metal layer to expose a portion of the second metal layer;

forming a capacitor on the second metal layer including the fourth insulating layer.

10. The method according to claim 9, further comprising the step of forming a third metal barrier layer between the first metal layer and the first semiconductor layer.

11. The method according to claim 9, further comprising the step of forming a fourth metal barrier layer between the third semiconductor layer and the second metal layer.

12. The method according to claim 9, wherein the step of forming the capacitor comprises the steps of:

successively depositing several atomic metal layers and annealing to form a third metal layer surrounding the second metal layer;

forming a dielectric film on the third metal layer including the third insulating layer; and forming a fourth metal layer on the dielectric film.

13. The method according to claim 12, wherein the third metal layer is formed to have a wrinkled portion on a surface of the third metal layer.

14. A method of fabricating a semiconductor device having a substrate, comprising the steps of:

forming a first metal layer on the substrate;

forming an ABC triblock copolymer on the first metal layer;

segregating the ABC triblock copolymer to an A copolymer, a B copolymer, and a C copolymer, the B copolymer surrounding the A copolymer, and the C copolymer surrounding the B copolymer on the substrate;

removing the A copolymer from the substrate;

successively forming a first semiconductor layer having a first type conductivity, a second semiconductor layer having a second type conductivity, a third semiconductor layer having the first type conductivity, and a second metal layer in a first space left after removing the A copolymer;

removing the B copolymer from the substrate;

forming a first insulating layer having a height as high as the middle of the first semiconductor layer in a second space left after removing the B copolymer;

forming a gate insulating layer on surfaces of the first, second, and third semiconductor layers;

forming a fourth semiconductor layer on the gate insulating layer;

removing the C copolymer from the substrate;

selectively removing the first metal layer using the fourth semiconductor layer and the first insulating layer as masks;

forming a plurality of bit lines on the substrate;

forming a second insulating layer having a height as high as the middle of the second semiconductor layer;

forming a plurality of word lines on the second insulating layer;

forming a third insulating layer on the second insulating layer including the word lines, the third insulating layer having a height as high as the middle of the third semiconductor layer;

oxidizing an exposed portion of the fourth semiconductor layer to form a gate electrode;

depositing a fourth insulating layer having a height as high as the middle of the second metal layer;

exposing a portion of the second metal layer;

forming a dielectric layer on the second metal layer; and forming a third metal layer on the dielectric layer.

15. The method according to claim 14, wherein the bit lines are formed to be connected with the first metal layer.

16. The method according to claim 14, wherein the word lines are formed to contact the fourth semiconductor layer.

17. The method according to claim 14, wherein the step of forming the bit lines comprises the steps of:

depositing several atom layers one by one on the substrate to form a fourth metal layer; and annealing the fourth metal layer so as to align the fourth metal layer in a direction to have a shortest distance between the first metal layer.

18. The method according to claim 14, wherein the step of forming the bit lines comprises the steps of:

applying a bias to the substrate in a direction where the bit lines are formed;

depositing several atom layers one by one to form a metal layer; and annealing the metal layer so that the metal layer has a direction in which the bias is applied.

19. The method according to claim 14, wherein a distance between the A and B copolymers in an X-axis direction is different from that in a Y-axis direction.

20. The method according to claim 19, wherein the distances are formed by adjusting weights of the A, B, and C copolymers.

21. A method of fabricating a semiconductor device having a substrate, comprising the steps of:

forming on an ABC triblock copolymer on the substrate; segregating the ABC trilock copolymer to including an A copolymer, a B copolymer surrounding the A copolymer, and a C copolymer surrounding the B copolymer on the substrate;

removing the A copolymer from the substrate;

forming a first semiconductor layer having a first type conductivity in a first space where the A copolymer is removed;

forming a second semiconductor layer having a second type conductivity on the first semiconductor layer and adjusting a doping concentration;

successively forming a third semiconductor layer having the first type conductivity and a second metal layer on the second semiconductor layer;

removing the B copolymer from the substrate;

selectively removing the first, second, and third semiconductor layers so that the second semiconductor layer has a circumferential recess around a middle portion of the second semiconductor layer;

forming a first insulating layer having a height as high as the middle of the first semiconductor layer in a second space where the B copolymer has been removed;

forming a first gate insulating layer on the first, second, and third semiconductor layers;

forming a quantum dot on the gate insulating layer around the circumferential recess;

forming a second gate insulating layer on the first gate insulating layer including the quantum dot;

forming a fourth semiconductor layer on the second gate insulating layer;

removing the C copolymer from the substrate;

forming a second insulating layer having a height as high as the middle of the third semiconductor layer; and oxidizing an exposed portion of the fourth semiconductor layer to form a gate electrode.

22. The method according to claim 21, wherein the step of forming the quantum dot comprises the steps of:

chemical-absorbing and depositing several silicon atom layers one by one to form a silicon layer;

annealing the silicon layer so that the silicon layer is thicker around the circumferential recess of the second semiconductor layer than the rest of the second semiconductor layer; and oxidizing the silicon layer to generate a quantum dot around the circumferential recess.

23. The method according to claim 21, wherein the step of oxidizing is executed under an ozone environment.

24. The method according to claim 21, wherein the doping concentration of the second semiconductor layer has a gradual gradient such that a highest concentration is at a center portion and a lowest concentration at an outer portion.

25. The method according to claim 24, wherein the center portion of the second semiconductor layer has an etching rate higher than the outer portion.

26. The method according to claim 24, wherein the first and second gate insulating layers are formed by depositing one $SiO_2$ molecular thickness layer by layer to obtain a desired thickness.

27. The method according to claim 24, wherein the fourth semiconductor layer is formed by absorbing one-atom thickness layer by layer to obtain a desired thickness.

28. The method according to claim 26, wherein the step of depositing one $SiO_2$ molecular thickness is performed by a chemical absorption process.

* * * * *